United States Patent
Minakawa

(10) Patent No.: US 8,847,675 B2
(45) Date of Patent: Sep. 30, 2014

(54) SEMICONDUCTOR DEVICE AND POWER CONTROL METHOD THEREFOR

(71) Applicant: Canon Kabushiki Kaisha, Tokyo (JP)

(72) Inventor: Takuya Minakawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/926,189

(22) Filed: Jun. 25, 2013

(65) Prior Publication Data

US 2014/0043072 A1 Feb. 13, 2014

(30) Foreign Application Priority Data

Aug. 10, 2012 (JP) ................................. 2012-178919

(51) Int. Cl.
*G05F 1/10* (2006.01)
*G05F 3/02* (2006.01)
*H03K 3/012* (2006.01)
*H03K 19/00* (2006.01)

(52) U.S. Cl.
CPC ............ *H03K 3/012* (2013.01); *H03K 19/0016* (2013.01); *H03K 19/0013* (2013.01)
USPC ............................. 327/544; 327/538; 327/540

(58) Field of Classification Search
USPC .......................... 327/530–546; 323/312–317
See application file for complete search history.

(56) References Cited

U.S. PATENT DOCUMENTS

| | | | | |
|---|---|---|---|---|
| 6,154,088 A | * | 11/2000 | Chevallier et al. | ............. 327/536 |
| 7,649,406 B2 | * | 1/2010 | Parris et al. | .................... 327/544 |
| 7,834,684 B2 | | 11/2010 | Fallah et al. | |
| 2007/0279100 A1 | * | 12/2007 | Fallah et al. | .................... 326/95 |
| 2008/0284491 A1 | * | 11/2008 | Veendrick et al. | ............. 327/427 |
| 2009/0174469 A1 | | 7/2009 | Fallah et al. | |

FOREIGN PATENT DOCUMENTS

JP 2009-147934 A 7/2009

* cited by examiner

*Primary Examiner* — Brandon S Cole
(74) *Attorney, Agent, or Firm* — Fitzpatrick, Cella, Harper & Scinto

(57) ABSTRACT

A semiconductor device comprises a plurality of circuit blocks, a plurality of local wirings which supply power to the plurality of circuit blocks, respectively, a global wiring which supplies the power to the plurality of local wirings, a plurality of first switches which are disposed between the plurality of local wirings, respectively, and the global wiring, and a second switch which is disposed between two local wirings. A power control unit controls open/close of the plurality of first switches and the second switch based on the potential difference between the two local wirings.

8 Claims, 6 Drawing Sheets

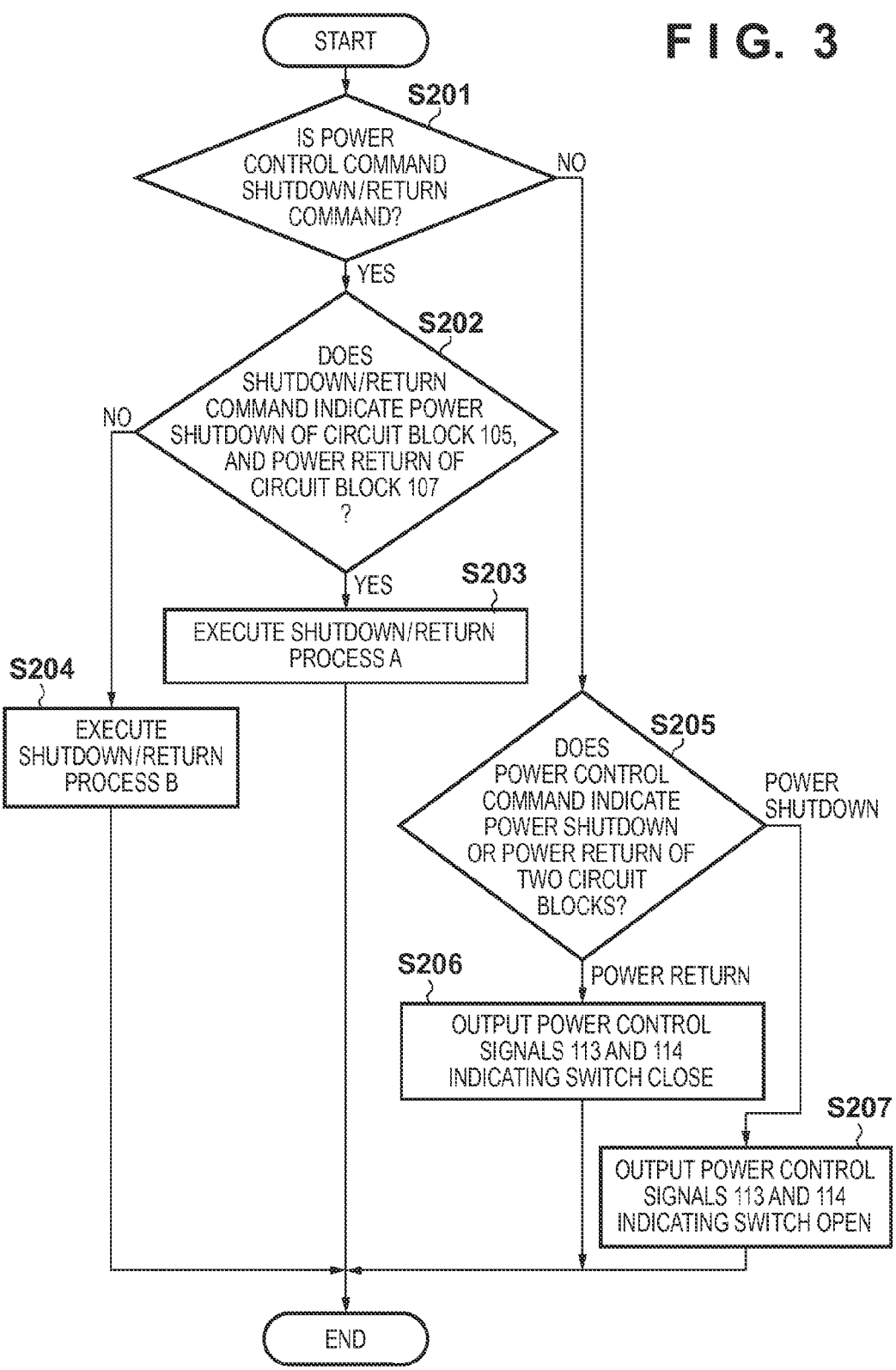

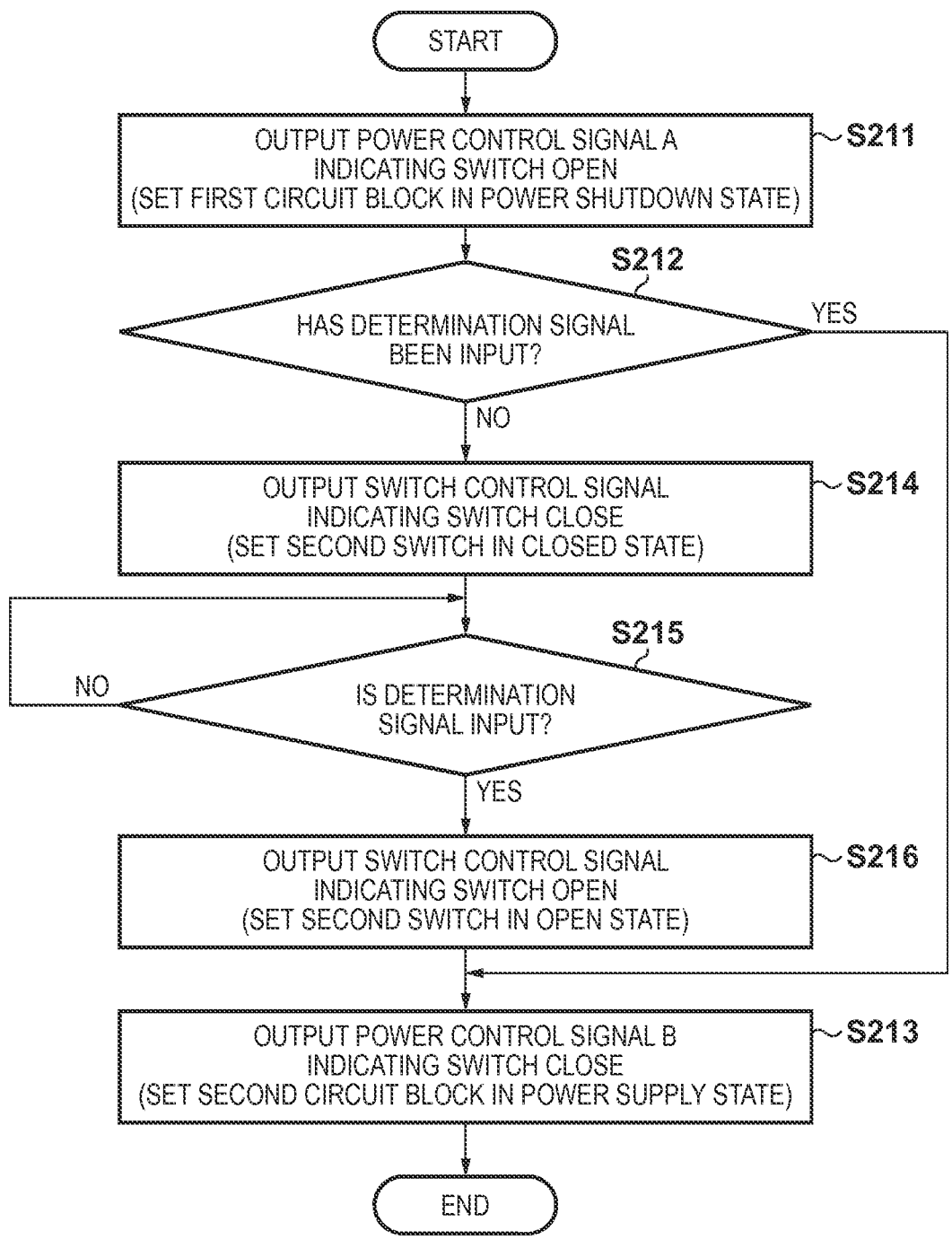

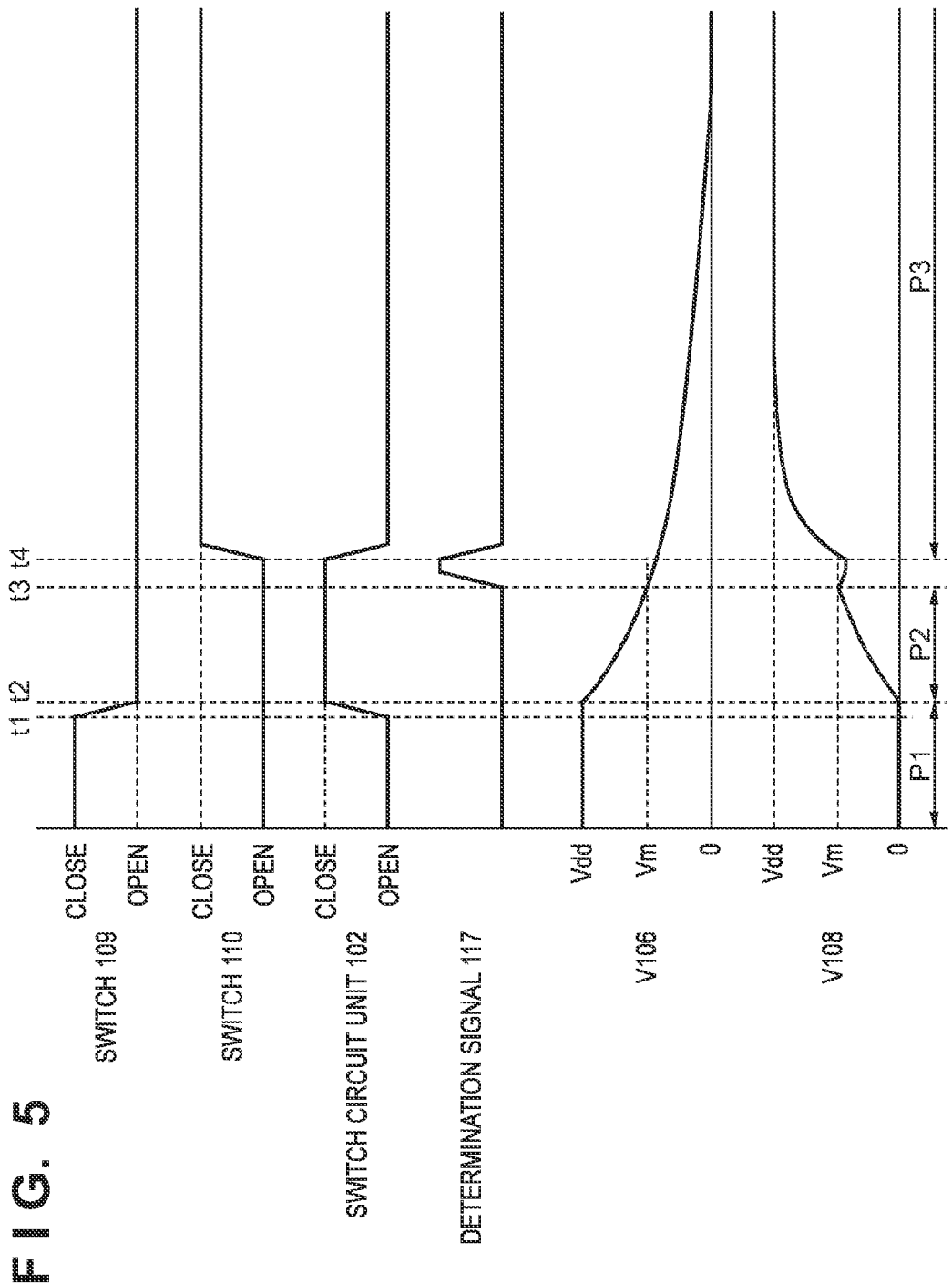

US 8,847,675 B2

SEMICONDUCTOR DEVICE AND POWER CONTROL METHOD THEREFOR

BACKGROUND OF THE INVENTION

1. Field of the Invention

The present invention relates to power control for a semiconductor device.

2. Description of the Related Art

As the process becomes finer with advances in semiconductor manufacturing technology, miniaturization of transistor elements has made rapid progress. As a result, the number (the degree of integration) of transistors that can be mounted on a chip with the same area increases, so the circuit scale has expanded to 10 or more times in several recent years. With an increase in circuit scale, the power consumed by the circuit also tends to increase. The power consumed by the circuit includes dynamic power and static power.

The dynamic power means power generated by a current which flows through the transistor due to a signal change. The dynamic power can be reduced by suppressing a signal change, and the clock gating technique of shutting down clock supply to the circuit for a period in which a circuit operation is unnecessary is employed as a measure to reduce the dynamic power.

On the other hand, the static power means power generated by a leak current which flows through the transistor even without a signal change. To reduce the static power, it is effective to keep the power voltage supplied to the transistor low, or shut down voltage supply. Hence, the power shutdown technique aiming at reducing the static power has become prevalent.

Note that an electric power wiring used for power supply to the transistors in the entire chip region will be referred to as a "global wiring" hereinafter, and that used for power supply from the global wiring to the transistors in some circuit blocks will be referred to a "local wiring" hereinafter.

In the power shutdown technique, switches implemented by, for example, transistors are connected between the global wiring and the local wiring of a circuit block to undergo power shutdown to make these two wirings electrically isolable so that the power supply and shutdown are switched by ON/OFF control of the switches as needed. In the circuit block having undergone power shutdown, a leak current disappears, so the consumption of static power due to a leak current can be cut.

Nowadays, by virtue of improvements in material and manufacturing method, a leak current no longer shows a tendency to exponentially increase, unlike the conventional cases, but still keeps a tendency to linearly increase, so the power shutdown technique will continue to play an important role as a method of reducing static power in the future. Also, a circuit block which requires power shutdown in a chip is expected to increase steadily and therefore occupy almost the entire chip after several years.

The charges stored in the capacitance of a circuit block having undergone power shutdown decrease upon removal with time, and disappear eventually. Therefore, to operate a circuit block again after power shutdown, it is necessary to charge the capacitance of the circuit block again. In other words, it is necessary to supply a charge corresponding to the capacitance of the circuit block, thus consuming power upon charging. This power consumption upon charging will be referred to as "charge power" hereinafter. That is, a circuit block in a power shutdown state consumes no static power, but generates charge power every time return to power supply is made.

The number of return operations of power supply per unit time increases in proportion to the number of circuit blocks to undergo power shutdown. In a chip with its entire configuration built by a circuit block to undergo power shutdown, an increase in charge power is more non-negligible than a reduction in static power, and this may inhibit the power reduction effect by the power shutdown technique.

In order to solve this problem, a technique called "charge recycle", in which charges lost upon discharge after power shutdown in one circuit block are distributed to the capacitance of another circuit block which returns from a power shutdown state to a power supply state. Using this technique, charges lost upon discharge after power shutdown in the conventional cases are recycled in power return to reduce the amount of charges to be supplied to the capacitance at the time of power return, and, in turn, to reduce the charge power.

In the above-mentioned technique, local power supplies in a plurality of circuit blocks are connected to each other via a switch (to be referred to as a "CR switch" hereinafter). The CR switch is switched at the timings of power shutdown and returns to connect or disconnect the local power supplies to or from each other, thereby performing a charge recycle.

The CR switch is switched using the timing measured by simulation before layout of a chip. That is, the switching timing of the CR switch, and the power return timing are always controlled to be constant. However, such timing control operations cannot cope with the case wherein, for example, the timing shifts due, for example, to individual variations of transistors in a chip, which occur upon evolution of technology nodes. Also, power that can be reduced originally may waste as charges cannot be optimally distributed to a capacitance.

SUMMARY OF THE INVENTION

In one aspect, a semiconductor device comprising: a plurality of circuit blocks which comprise at least a first circuit block and a second circuit block; a plurality of local wirings which supply power to the plurality of circuit blocks, respectively; a global wiring which supplies the power to the plurality of local wirings; a plurality of first switches which are disposed between the plurality of local wirings, respectively, and the global wiring; a second switch which is disposed between two local wirings; and a control unit configured to control open/close of the plurality of first switches and the second switch based on a potential difference between the two local wirings.

According to the aspect, it is possible to implement charge recycle for effectively reducing the charge power of a semiconductor device.

Further features of the present invention will become apparent from the following description of exemplary embodiments with reference to the attached drawings.

BRIEF DESCRIPTION OF THE DRAWINGS

FIG. 3 is a flowchart for explaining the operation of a power control unit.

FIG. 4 is a flowchart for explaining a shutdown/return process.

FIG. 5 is a chart for explaining the state transition of the semiconductor device in the shutdown/return process.

DESCRIPTION OF THE EMBODIMENTS

A semiconductor device and power control therefor in an embodiment according to the present invention will be described in detail below with reference to the accompanying drawings.

[Configuration of Semiconductor Device]

The configuration of a semiconductor device 100 in the embodiment will be described with reference to a block diagram shown in FIG. 1.

Figure 1:
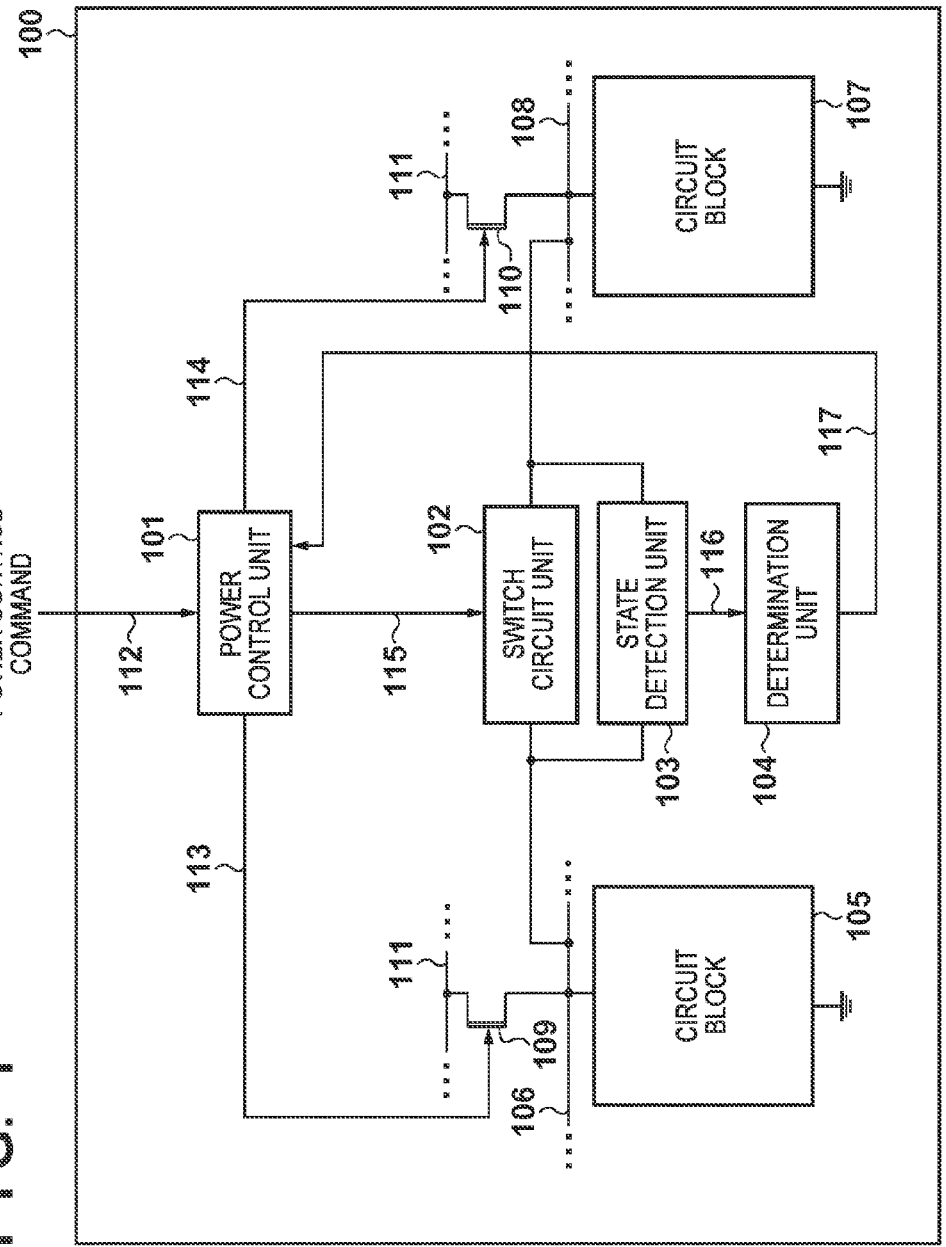
FIG. 1 is a block diagram for explaining the configuration of a semiconductor device according to an embodiment.

Referring to FIG. 1, an electric power wiring 111 serving as a global wiring supplies power to each circuit block. A first circuit block 105 is connected to an internal electric power wiring 106, and one or more switches 109 are connected between the electric power wiring 111 and the internal electric power wiring 106 serving as a local wiring. Similarly, a second circuit block 107 is connected to an internal electric power wiring 108, and one or more switches 110 are connected between the electric power wiring 111 and the internal electric power wiring 108 serving as a local wiring.

A power control unit 101 receives a power control command 112 from the outside, receives a determination signal 117 from a determination unit 104, and outputs power control signals 113 and 114 and a switch control signal 115. The power control command 112 includes one or more commands to perform power control. The details of the commands include, for example, a command to shut down the power of a specific block, a command to return the power of the specific circuit block, and a command indicating the order of power shutdown and return for each circuit block. The power control unit 101 outputs the power control signals 113 and 114 for controlling power supply and shutdown to the switches 109 and 110, and outputs the switch control signal 115 which controls open/close of a switch circuit unit 102, based on the determination signal 117 and the details of the power control command 112.

The switches 109 and 110 serving as first switches are implemented by, for example, PMOS transistors, each of which has its source terminal connected to the electric power wiring 111, and its drain terminal connected to the internal electric power wiring 106 or internal electric power wiring 108. If the first switches are implemented by, for example, PMOS transistors, the power control signals 113 and 114 corresponding to power supply serve to make the gate voltages of the transistors equal to the ground potential. In accordance with these signals, the drain-to-source paths of the transistors become electrically continuous (the first switches are set in a closed state). Also, the power control signals 113 and 114 corresponding to power shutdown serve to make the gate voltages of the transistors equal to the voltage of power supplied to the electric power wiring 111. In accordance with these signals, the drain-to-source paths of the transistors become electrically discontinuous (the first switches are set in an open state).

Although details will be described later, the switch circuit unit 102 serving as a second switch corresponds to the above-mentioned CR switch, and is connected between the internal electric power wirings 106 and 108 so as to connect local wirings to each other, and receives the switch control signal 115 from the power control unit 101. Note that the switch circuit unit 102 is normally in an open state.

A state detection unit 103 detects the states of the internal electric power wirings 106 and 108, and outputs state information 116 indicating the detection result. The state detection unit 103 can be implemented using, for example, a voltage detector (for example, a differential amplifier such as an operational amplifier) which detects a potential difference ΔV between the voltage of the internal electric power wiring 106 and that of the internal electric power wiring 108.

The determination unit 104 receives the state information 116 from the state detection unit 103, and outputs the determination signal 117. The determination unit 104 can be implemented using, for example, an analog comparator. The determination unit 104 compares the potential difference ΔV indicated by the state information 116 with a reference value Vr set in advance, and outputs a determination signal 117 indicating the comparison result. A reference potential difference is set to the reference value Vr. Although the reference potential difference is ideally zero, Vr=0.1 V, for example, is set in consideration of, for example, the detection limit of the state detection unit 103. That is, the determination unit 104 outputs a determination signal 117 indicating the end of a power shutdown/return process (to be described later) if the potential difference between the internal electric power wirings 106 and 108 is equal to or smaller than the reference value (ΔV≤Vr), or does not output a determination signal 117 if this potential difference is larger than the reference value (ΔV>Vr).

•Switch Circuit Unit

Figure 2:
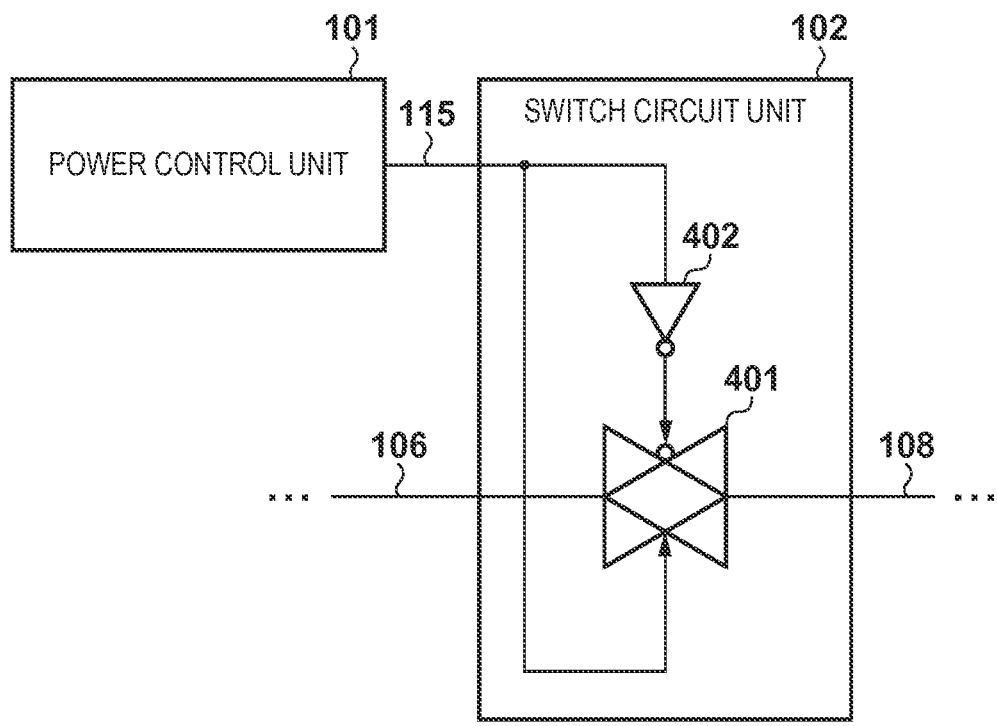
FIG. 2 is a block diagram for explaining the configuration of a switch circuit unit.

The configuration of the switch circuit unit 102 will be described with reference to a block diagram shown in FIG. 2.

The switch circuit unit 102 is implemented by, for example, a pass transistor circuit 401 and inverter circuit 402. The pass transistor circuit 401 is implemented by, for example, a transmission gate which combines a PMOS transistor and an NMOS transistor.

The switch control signal 115 input from the power control unit 101 is directly input to one gate of the pass transistor circuit 401. The switch control signal 115 sent via the inverter circuit 402 is input to the other gate of the pass transistor circuit 401.

In accordance with a switch control signal 115 with a potential at which the pass transistor circuit 401 becomes electrically continuous, the switch circuit unit 102 is set in electrical continuity (the second switch is set in a closed state). Also, in accordance with a switch control signal 115 with a potential at which the pass transistor circuit 401 becomes electrically discontinuous, the switch circuit unit 102 is set in electrical discontinuity (the second switch is set in an open state). That is, if the potential of the switch control signal 115 is higher than the threshold of the pass transistor circuit 401, the switch circuit unit 102 closes, and the internal electric power wirings 106 and 108 become electrically continuous with each other. On the other hand, if the potential of the switch control signal 115 is lower than the threshold of the pass transistor circuit 401, the switch circuit unit 102 opens, and the internal electric power wirings 106 and 108 become discontinuous from each other.

[Operation of Power Control Unit]

The operation of the power control unit 101 will be described with reference to a flowchart shown in FIG. 3. The power control unit 101 starts a process shown in FIG. 3 when a power control command 112 is input, or a determination signal 117 is input when the power control command 112 has already been input.

The power control unit 101 determines whether the input power control command 112 is a command (to be referred to as a power shutdown/return command hereinafter) to shut down the power of one of the circuit blocks 105 and 107, and return the power of the other (S201). If the power control command 112 is a power shutdown/return command, the process proceeds to step S202; otherwise, the process proceeds to step S209.

If the power control command 112 is a power shutdown/return command, the power control unit 101 shuts down the power of the circuit block 105, and determines whether the power shutdown/return command is a command to return the power of the circuit block 107 (S202). If the power control command 112 indicates power shutdown of the circuit block 105 or power return of the circuit block 107, the process proceeds to step S203; otherwise, the process proceeds to step S205.

If the power control command 112 indicates power shutdown of the circuit block 105, and power return of the circuit block 107, the power control unit 101 executes shutdown/return process A (S203). However, if the power control command 112 indicates power return of the circuit block 105, and power shutdown of the circuit block 107, the power control unit 101 executes shutdown/return process B (S204).

On the other hand, if the power control command 112 is not a shutdown/return command, the power control unit 101 determines whether the power control command 112 is a return command or shutdown command of the powers of both the circuit blocks 105 and 107 (S205). If the power control command 112 is a command to return the powers of both the circuit blocks 105 and 107, power control signals 113 and 114 indicating switch close, which correspond to power supply, are output (S206). However, if the power control command 112 is a command to shut down the powers of both the circuit blocks 105 and 107, power control signals 113 and 114 indicating switch open, which correspond to power shutdown, are output (S207).

A shutdown/return process will be described with reference to a flowchart shown in FIG. 4. Note that in the following description, the relationships among the configuration shown in FIG. 1, circuit blocks A and B, and power control signals A and B are as follows:
shutdown/return process A (power shutdown of the circuit block 105, and power return of the circuit block 107)
    circuit block A to undergo power shutdown corresponds to the circuit block 105,
    circuit block B to undergo power return corresponds to the circuit block 107,
    power control signal A corresponds to the power control signal 113, and
    power control signal B corresponds to the power control signal 114;
shutdown/return process B (power shutdown of the circuit block 105, and power return of the circuit block 107)
    circuit block A to undergo power shutdown corresponds to the circuit block 107,
    circuit block B to undergo power return corresponds to the circuit block 105,
    power control signal A corresponds to the power control signal 114, and
    power control signal B corresponds to the power control signal 113.

The power control unit 101 outputs power control signal A indicating switch open (S211), and determines whether a determination signal 117 has been input (S212). If a determination signal 117 has been input (the potential difference $\Delta V$ between the internal electric power wirings 106 and 108 is sufficiently small), the power control unit 101 outputs power control signal B indicating switch close (S213), and ends the process.

On the other hand, if a determination signal 117 has not been input (the potential difference $\Delta V$ between the internal electric power wirings 106 and 108 is large), the power control unit 101 outputs a switch control signal 115 indicating close of the switch circuit unit 102 (S214), and determines whether a determination signal 117 is input (S215). If a determination signal 117 is input, the power control unit 101 outputs a switch control signal 115 indicating open of the switch circuit unit 102 (S216), outputs power control signal B indicating switch close (S213), and ends the process.

In a shutdown/return process, the potential difference $\Delta V$ is normally assumed to be approximately zero if it is sufficiently small from the beginning. However, the determination operation in step S212 is done in consideration of a circuit block in which the potential of a local wiring rapidly drops as, for example, the capacitance of a circuit block is very low, or the impedance of the discharge path of a circuit block is very low. If such a circuit block is absent, the process may proceed from step S211 to step S214 upon jumping the determination operation in step S212.

As another example, in steps S212 and S215, the power control unit 101 looks up the determination result obtained by the determination unit 104 in accordance with the determination signal 117, and performs the above-mentioned determination operation in accordance with whether the determination result indicates $\Delta V \leq Vr$ or $\Delta V > Vr$.

[State Transition]

The state transition of the semiconductor device 100 in a shutdown/return process will be described with reference to FIG. 5.

In an interval P1 before the start of a shutdown/return command process by the power control unit 101, the semiconductor device 100 is in the following state. That is, the power control signal 113 indicates close of the switches 109, the circuit block 105 is in a power supply state, and a potential V106 of the internal electric power wiring 106 is nearly equal to a potential Vdd of the electric power wiring 111. On the other hand, the power control signal 114 indicates open of the switches 110, and the circuit block 107 is in a power shutdown state. A potential V108 of the internal electric power wiring 108 has lowered to almost the ground potential (almost 0 V) upon removal of the charges stored in the circuit block 107.

In the interval P1, state information 116 output from the state detection unit 103 indicates a potential difference ($\Delta V = Vdd$) that is nearly equal to the difference between the potential of the electric power wiring 111 and the ground potential. Since the potential difference $\Delta V$ indicated by the state information 116 is sufficiently larger than a reference value Vr (for example, 0.1 V), the determination unit 104 does not output a determination signal 117.

At timing t1, the power control unit 101 receives a power control command 112, and determines the details of this command. The details are assumed to include a shutdown/return command indicating power shutdown of the circuit block 105, and power return of the circuit block 107. The power control unit 101 outputs a power control signal 113 which opens the switches 109, and a switch control signal 115 which closes the switch circuit unit 102.

At timing t2, the switches 109 is set in an open state, so power supply to the internal electric power wiring 106 from the electric power wiring 111 via the switches 109 is shut down, and the circuit block 105 is set in a power shutdown state. Further, the switch circuit unit 102 is set in a closed state, so the internal electric power wirings 106 and 108 become electrically continuous with each other via the switch circuit unit 102. As a result, the charges stored in the circuit block 105 partially move to the circuit block 107 (a current flows).

Figure 6A:
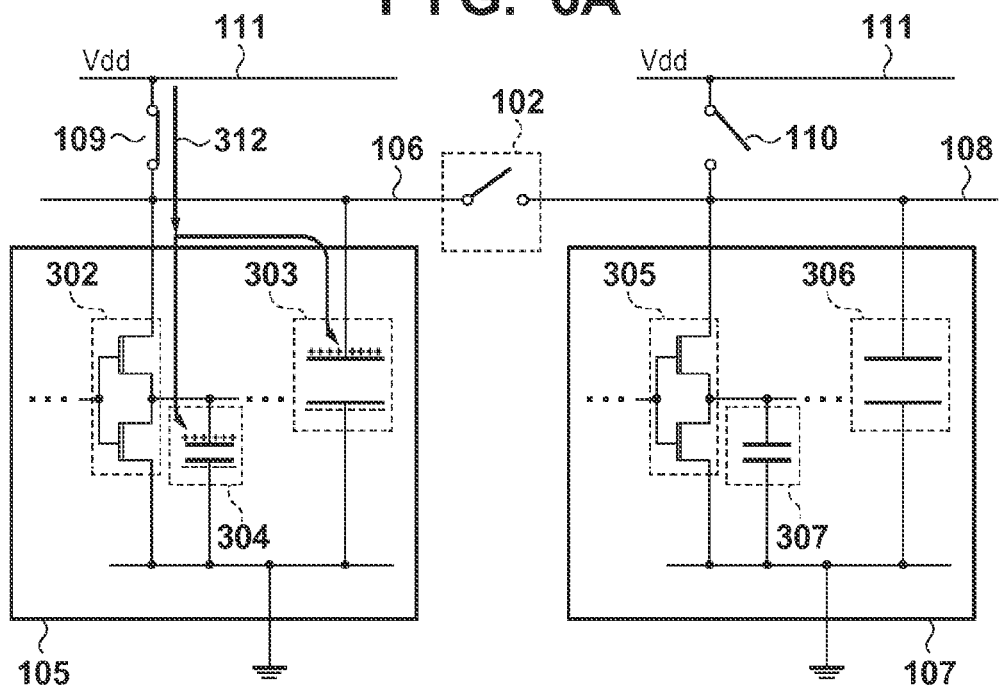
FIGS. 6A and 6B are circuit diagrams for explaining charge movement.
Figure 6B:
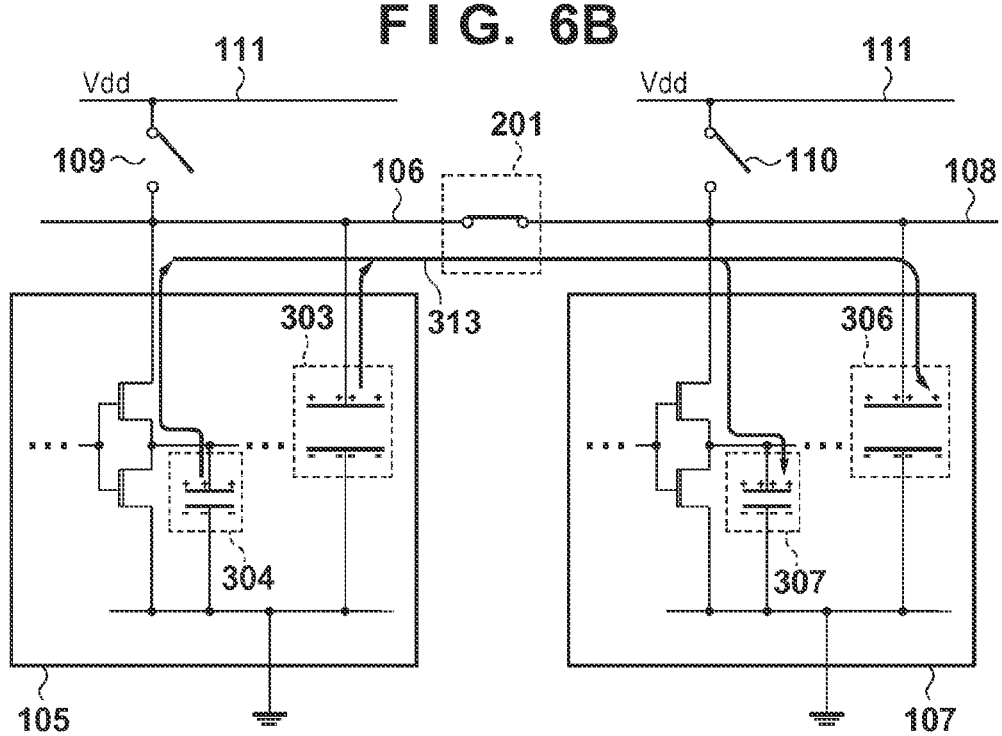

Charge movement will be described with reference to FIGS. 6A and 6B. FIG. 6A shows that the circuit block 105 is in a power supply state, the circuit block 107 is in a power shutdown state, and the switch circuit unit 102 is in an open state. Also, FIG. 6B shows that the circuit block 105 changes from a power supply state to a power shutdown state in response to a shutdown/supply command, the switch circuit unit 102 changes from an open state to a closed state, and the circuit block 107 remains in a power shutdown state. Note that arrows 312 and 313 indicate charge movement (current flow).

In general, the circuit block 105 includes, for example, a circuit 302 implemented by a transistor, a capacitance 303 between the internal electric power wiring 106 and the ground wiring, and a capacitance 304 between the signal wiring and the ground wiring. Similarly, the circuit block 107 includes, for example, a circuit 305 implemented by a transistor, a capacitance 306 between the internal electric power wiring 108 and the ground wiring, and a capacitance 307 between the signal wiring and the ground wiring.

In a state shown in FIG. 6A, in the circuit block 105 in a power supply state, as indicated by the arrow 312, a current flows from the electric power wiring 111 to the capacitances 303 and 304, so charges are stored in the capacitances 303 and 304. On the other hand, in the circuit block 107 in a power shutdown state, no current flows from the electric power wiring 111 to the circuit block 107, so the stored charges may be removed but are not stored. Therefore, as the stored charges are removed, the potential V108 of the internal electric power wiring 108 drops up to almost the potential of the ground wiring (almost 0 V).

As shown in FIG. 6B, after power shutdown of the circuit block 105 is done, the current flow changes upon closing the switch circuit unit 102. That is, a current indicated by the arrow 313 flows from the circuit block 105 at a high potential (almost Vdd) as charges are stored in the capacitances 303 and 304 to the capacitances 306 and 307 of the circuit block 107 at a low potential (almost 0 V). That is, the charges stored in the capacitances 303 and 304 of the circuit block 105 partially move to the capacitances 306 and 307 of the circuit block 107. As a result, as indicated by an interval P2, the potential V106 of the internal electric power wiring 106 drops, while the potential V108 of the internal electric power wiring 108 rises.

In the interval P2, the state detection unit 103 continuously detects the potential difference ΔV between the internal electric power wirings 106 and 108, and outputs state information 116 indicating the detected potential difference ΔV. The determination unit 104 continuously compares the potential difference ΔV indicated by the state information 116 with the reference value Vr (for example, 0.1 V), and outputs a determination signal 117 indicating the end of the shutdown/return process when the potential difference ΔV becomes equal to or smaller than the reference value Vr (ΔV≤Vr) at timing t3. That is, at timing t3, both the potential V106 of the internal electric power wiring 106, and the potential V108 of the internal electric power wiring 108 become nearly equal to an intermediate potential Vm, so the potential difference ΔV becomes sufficiently small.

Using a determination signal 117 as a trigger, the power control unit 101 outputs a switch control signal 115 which opens the switch circuit unit 102, and a power control signal 114 which closes the switches 110 at timing t4. As a result, in an interval P3, a current flows from the electric power wiring 111 to the capacitances 306 and 307 of the circuit block 107 that has changed to a power supply state to store charges in the capacitances 306 and 307, so the potential V108 of the internal electric power wiring 108 rises up to almost the potential of the electric power wiring 111.

On the other hand, in the interval P3, the charges stored in the capacitances 303 and 304 of the circuit block 105 in a power shutdown state are removed, so the potential V106 of the internal electric power wiring 106 drops up to almost the potential of the ground wiring (almost 0 V). Note that in the interval P3, the potential difference between the internal electric power wirings 106 and 108 becomes larger than the reference value (ΔV>Vr), so the determination unit 104 stops the output of the determination signal 117.

With this arrangement, the potential difference ΔV between the circuit blocks connected to the local wirings, respectively, is monitored to connect a circuit block having undergone power shutdown (to be referred to as a shutdown block hereinafter), and a circuit block to undergo power return (to be referred to as a return block hereinafter) to each other via a CR switch. Then, when the potential difference ΔV between these two blocks has become sufficiently small, the CR switch is set in an open state to supply power to the return block. Therefore, the switching timing of the CR switch, and the power return timing are controlled based on the potential difference ΔV between the blocks so that charges which are stored in the shutdown block and can move to the return block reliably move to the return block. As a result, charge recycle for effectively reducing the charge power is attained free from the influence of, for example, individual variations of transistors in a chip.

Modification of Embodiment

An example in which the present invention is applied to a semiconductor device 100 including two circuit blocks 105 and 107 has been described above. However, the present invention is applicable to a semiconductor device including a plurality of circuit blocks. In this case, a first switch is disposed for each circuit block. Also, a second switch is disposed between two adjacent circuit blocks.

The present invention is also applicable to a semiconductor device including four circuit blocks, and four second switches disposed to connect these circuit blocks in a ring shape. If the power control unit 101 receives a command which sets the first circuit block in a power supply state, and the second to fourth circuit blocks in a power supply state, it performs the following control operation. The first switch connected to the local wiring of the first circuit block is set in an open state, and all the second switches are set in a closed state. Then, when a determination signal 117 is output, all the second switches are set in an open state, and the first switches connected to the local wirings of the second to fourth circuit blocks are set in a closed state.

Also, if the power control unit 101 receives a command which sets the first to third circuit blocks in a power shutdown state, and the fourth circuit block in a power supply state, it performs the following control operation. The first switches connected to the local wirings of the first to third circuit blocks are set in an open state, and all the second switches are set in a closed state. Then, when a determination signal 117 is output, all the second switches are set in an open state, and the first switch connected to the local wiring of the fourth circuit block is set in a closed state.

Moreover, if the power control unit 101 receives a command which sets the first and second circuit blocks in a power shutdown state, and the third circuit block in a power supply state, it performs the following control operation. The first switches connected to the local wirings of the first and second circuit blocks are set in an open state, and the two second switches disposed between the first circuit block and the second and third circuit blocks are set in a closed state. Then, when a determination signal 117 is output, all the second switches are set in an open state, and the first switch connected to the local wiring of the third circuit block is set in a closed state.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-178919 filed Aug. 10, 2012, which is hereby incorporated by reference herein in its entirety.

What is claimed is:

1. A semiconductor device comprising:
   a plurality of circuit blocks which comprise at least a first circuit block and a second circuit block;
   a plurality of local wirings which supply power to the plurality of circuit blocks, respectively;
   a global wiring which supplies the power to the plurality of local wirings;
   a plurality of first switches which are disposed between the plurality of local wirings, respectively, and the global wiring;
   a second switch which is disposed between two local wirings;
   a control unit configured to control open/close of the plurality of first switches and the second switch based on a potential difference between the two local wirings; and
   a determination unit configured to generate a determination signal indicating that a potential difference between the two local wirings is not more than a reference value,
   wherein the control unit controls open/close of the plurality of first switches and the second switch in accordance with a power control command and the determination signal.

2. The device according to claim 1, wherein, in a case where receiving the power control command which sets the first circuit block in a power shutdown state, and returns the second circuit block to a power supply state, the control unit sets, in an open state, a first switch connected to a local wiring of the first circuit block, and sets, in a closed state, the second switch disposed between the local wiring of the first circuit block and a local wiring of the second circuit block,
   wherein, in a case where the determination signal is generated by the determination unit after the reception of the power control command, the control unit sets the second switch in an open state, and sets, in a closed state, a first switch connected to the local wiring of the second circuit block.

3. The device according to claim 1, wherein, in a case where receiving the power control command which sets the first circuit block in a power shutdown state, and returns the second circuit block to a power supply state, the control unit sets a first switch connected to a local wiring of the first circuit block in an open state, and determines whether or not the determination signal is generated by the determination unit, and
   in a first case where it is determined that the determination signal is generated, the control unit sets a first switch connected to a local wiring of the second circuit block in a closed state, or
   in a second case where it is determined that the determination signal is not generated, the control unit sets, in a closed state, the second switch disposed between the local wiring of the first circuit block and the local wiring of the second circuit block,
   wherein, in a case where the determination signal is generated by the determination unit after the second case occurs, the control unit sets the second switch in an open state, and sets the first switch connected to the local wiring of the second circuit block in a closed state.

4. The device according to claim 1, wherein the determination unit comprises a detection unit configured to detect a potential difference between the two local wirings.

5. A control method of a semiconductor device which has a plurality of circuit blocks comprising at least a first circuit block and a second circuit block, a plurality of local wirings supplying power to the plurality of circuit blocks respectively, a global wiring supplying the power to the plurality of local wirings, a plurality of first switches disposed between the plurality of local wirings, respectively, and the global wiring, and a second switch disposed between two local wirings, the method comprising the steps of:
   controlling open/close of the plurality of first switches and the second switch based on a potential difference between the two local wirings; and
   generating a determination signal indicating that a potential difference between the two local wirings is not more than a reference value,
   wherein the control of open/close of the plurality of first switches and the second switch in the controlling step is performed in accordance with a power control command and the determination signal.

6. The method according to claim 5, wherein, in a case where receiving the power control command which sets the first circuit block in a power shutdown state, and returns the second circuit block to a power supply state, in the controlling step, a first switch connected to a local wiring of the first circuit block is set in an open state, and the second switch disposed between the local wiring of the first circuit block and a local wiring of the second circuit block is set in a closed state,
   wherein, in a case where the determination signal is generated after the reception of the power control command, in the controlling step, the second switch is set in an open state, and a first switch connected to the local wiring of the second circuit block is set in a closed state.

7. The method according to claim 5, wherein, in a case where receiving the power control command which sets the first circuit block in a power shutdown state, and returns the second circuit block to a power supply state, in the controlling step, a first switch connected to a local wiring of the first circuit block is set in an open state, and it is determined whether or not the determination signal is generated in the determining step, and
   in a first case where it is determined that the determination signal is generated, a first switch connected to a local wiring of the second circuit block is set in a closed state in the controlling step, or
   in a second case where it is determined that the determination signal is not generated, the second switch disposed between the local wiring of the first circuit block and the local wiring of the second circuit block is set in a closed state in the controlling step,
   wherein, in a case where the determination signal is generated in the determining step after the second case occurs, in the controlling step, the second switch is set in an open state, and the first switch connected to the local wiring of the second circuit block is set in a closed state.

8. The method according to claim 5, wherein the device further comprises a detection unit configured to detect a potential difference between the two local wirings so as to use a detection result in the determining step.

* * * * *